United States Patent
Wang

(10) Patent No.: US 7,604,485 B1
(45) Date of Patent: Oct. 20, 2009

(54) CHIP SOCKET FOR BASIC INPUT/OUTPUT SYSTEM

(75) Inventor: Hai-Li Wang, Shenzhen (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/413,591

(22) Filed: Mar. 29, 2009

(30) Foreign Application Priority Data

Dec. 24, 2008 (CN) .......................... 2008 1 0306515

(51) Int. Cl.
*H01R 12/00* (2006.01)
(52) U.S. Cl. ............................. 439/69; 439/638; 439/70
(58) Field of Classification Search ............. 439/68–70, 439/75, 638
See application file for complete search history.

(56) References Cited

U.S. PATENT DOCUMENTS

| 4,045,105 | A  | * | 8/1977 | Lee et al. ....................... 439/69 |
| 7,354,278 | B2 | * | 4/2008 | Pan ............................... 439/70 |
| 2008/0115122 | A1 | * | 5/2008 | Wang ........................... 717/168 |

* cited by examiner

*Primary Examiner*—Tho D Ta
(74) *Attorney, Agent, or Firm*—Zhigang Ma

(57) ABSTRACT

A chip socket includes first and second bottom plates attached together, four first sidewalls and second sidewalls, and a number of first and second conductive. Each of the first sidewalls vertically extends upward from a side of the first bottom plate. The first conductive metal sheets are fixed in an inner side of each of the first sidewalls. The conductive metal sheets are insulated from one another. Each of the second sidewalls vertically extends downward from a side of the second bottom plate. The second conductive metal sheets are fixed in an inner side of each of the second sidewalls. The second conductive metal sheets are insulated from one another. Each of the first conductive metal sheets are connected to a corresponding second conductive metal sheet by the first conductive metal sheet extending through the first and second bottom plates to contact with the second conductive metal sheet.

11 Claims, 4 Drawing Sheets

CHIP SOCKET FOR BASIC INPUT/OUTPUT SYSTEM

BACKGROUND

1. Technical Field

The present disclosure relates to chip sockets, and more particularly to a chip socket for mounting a basic input/output system (BIOS).

2. Description of Related Art

A basic input/output system (BIOS) chip is mounted on a computer motherboard for storing vital programming codes. The programming codes are run by the computer when first powered on. For example, the BIOS chip checks the complementary metal oxide semiconductor (CMOS) setup for custom settings, initiates registers and power management, and performs the power-on self-test (POST). Errors may occur in the programming codes of the BIOS chip through improper flashing of the BIOS chip or improper operation of the computer. In such a situation, either the BIOS cannot be loaded, or invalid settings are assigned to components of the computer. It is inconvenient, time-consuming to replace the damaged BIOS chip with a new one because the BIOS chip is commonly welded on the motherboard, and on the other hand, it would be a waste of wiring space of the motherboard to pre-provide a back-up BIOS chip.

DETAILED DESCRIPTION

Figure 1:
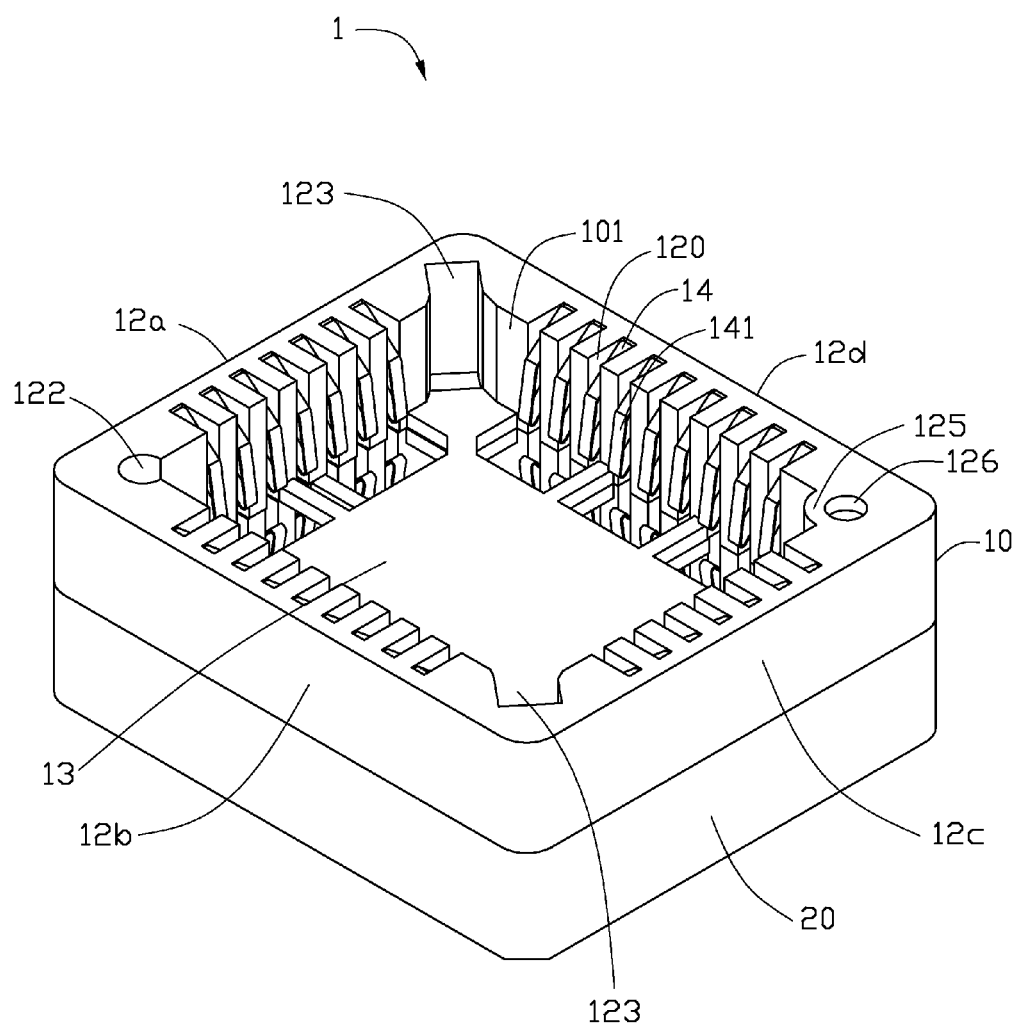
FIG. 1 is an assembled, isometric view of an embodiment of a chip socket; the chip socket includes an upper part.
Figure 2:
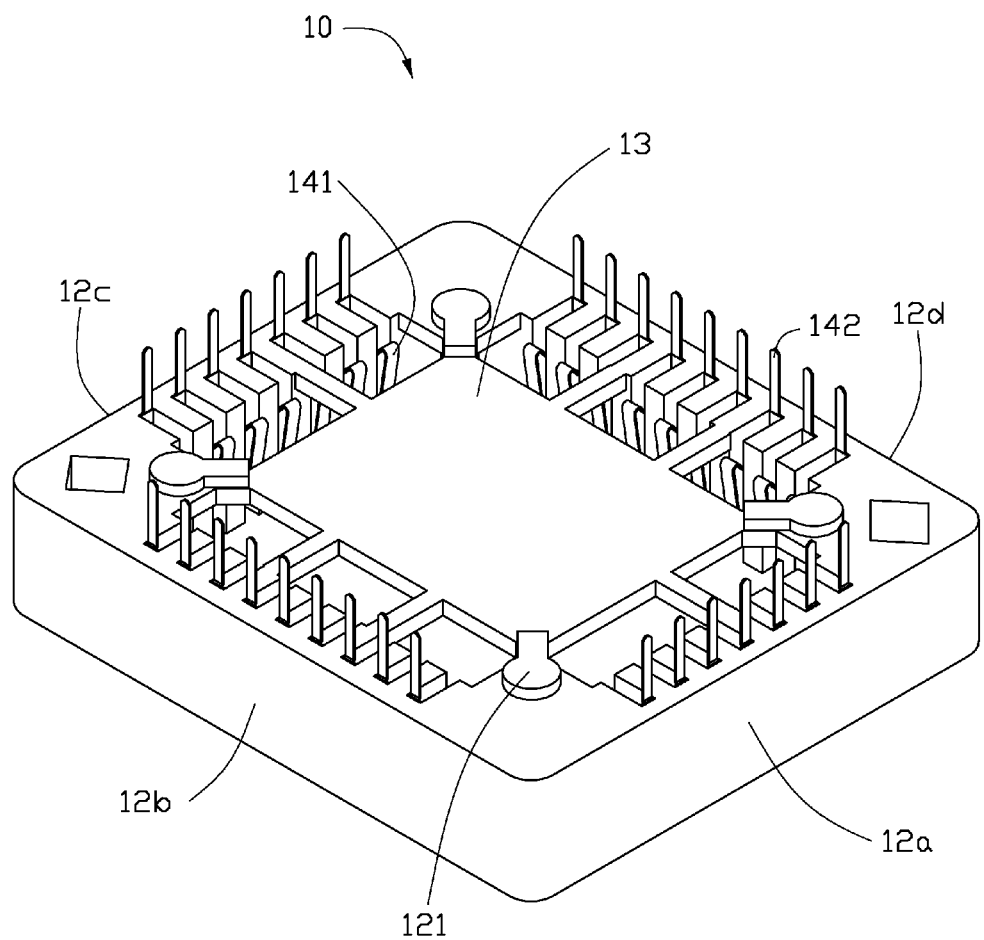
FIG. 2 is an isometric view of the upper part of FIG. 1, being placed upside down and showing bottom structure.

Referring to FIGS. 1 and 2, an embodiment of a chip socket 1 includes an upper part 10 and a lower part 20 jointing together. The chip socket 1 is a basic input/output system (BIOS) socket. The upper part 10 includes a rectangular bottom plate 13, four sidewalls 12a-12d perpendicularly extending up from sides of the bottom plate 13, and a plurality of conductive metal sheets 14. The bottom plate 13 and the four sidewalls 12a-12d cooperate to bound a first receiving portion 101.

A plurality of narrow slots 120 is defined in inner sides of the sidewalls 12a-12d. Numbers of the narrow slots 120 defined in the sidewalls 12a and 12d are the same. Numbers of the narrow slots 120 defined in the sidewalls 12b and 12c are the same. Foolproof guides are defined in inner corners of the first receiving portion 101. The foolproof guides includes an arc-shaped groove 122 defined in the corner between the sidewalls 12a and 12b, two rectangular grooves 123 respectively defined between sidewalls 12a and 12d and sidewalls 12b and 12c, and a protrusive block 125 protrudes from the corner between the sidewalls 12c and 12d. A circular groove 126 is defined in a top surface of the corner between the sidewalls 12c and 12d. Four pads 121 are formed on a bottom surface of the bottom plate 13. In this embodiment, the pads 121 are arranged at the corners of the bottom surface of the bottom plate 13.

Each of the plurality of conductive metal sheets 14 is fixed in a corresponding narrow slot 120. Each of the conductive metal sheets 14 includes a contacting terminal 141 and a splicing terminal 142. The contacting terminal 141 of each of the conductive metal sheets 14 is elastically received in the corresponding narrow slot 120. The splicing terminal 142 of each of the conductive metal sheets 14 extends straightly through the bottom plate 13. The plurality of conductive metal sheets 14 is insulated from one another.

Figure 3:
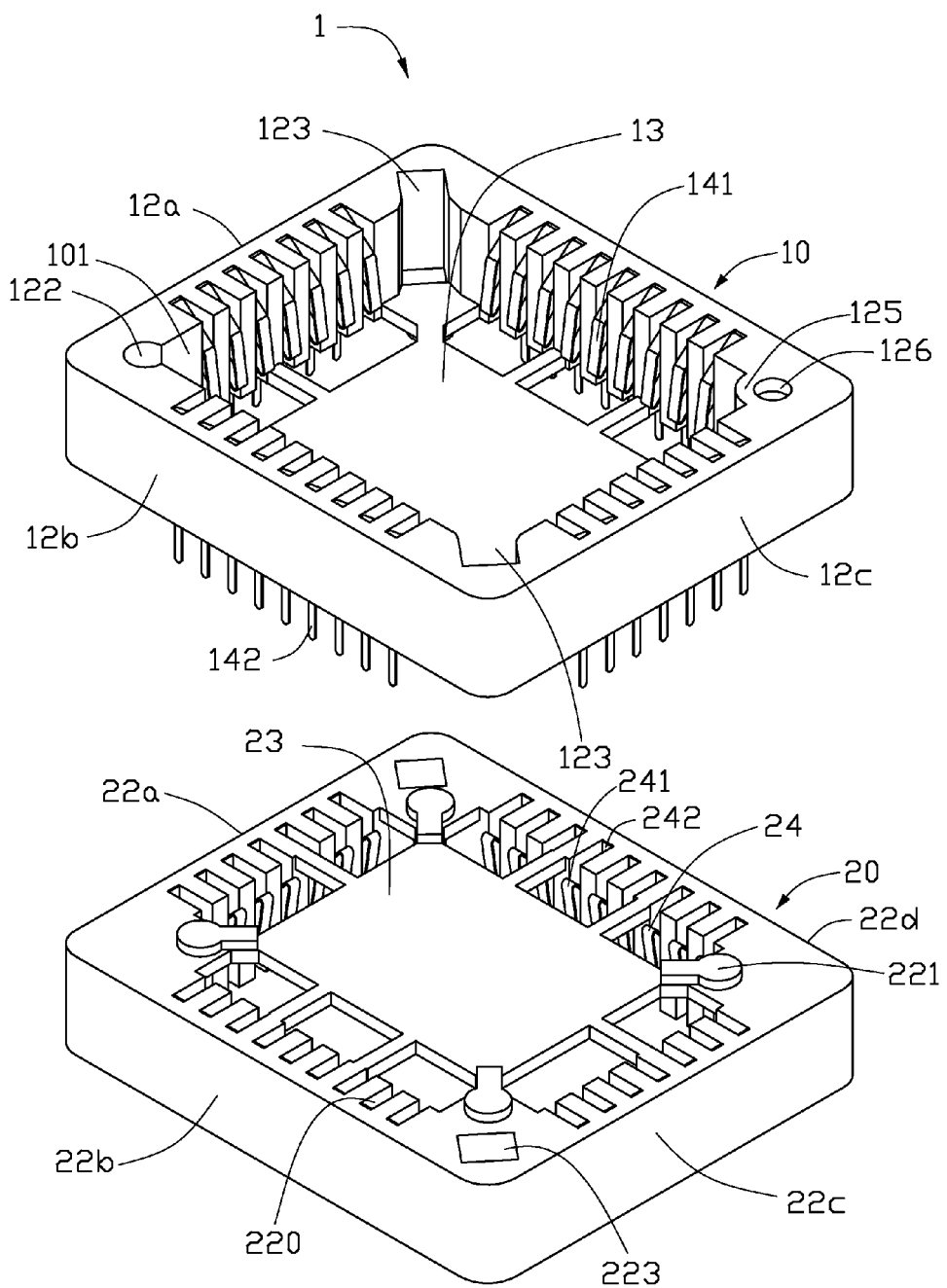
FIG. 3 is an exploded, isometric view of the chip socket of FIG. 1.

Referring to FIG. 3, the lower part 20 includes a rectangular bottom plate 23, four sidewalls 22a-22d extending from four sides of the bottom plate 23, and a plurality of conductive metal sheets 24. The bottom plate 23 and the four sidewalls 22a-22d cooperate to bound a second receiving portion. The lower part 20 also defines foolproof guides. The foolproof guides of the lower part 20 include an arc-shaped groove, two rectangular grooves 223, and a protrusive block, which are shaped and arranged similar to the foolproof guides of the upper part 10. The lower part 20 defines a circular groove shaped and arranged similar to the circular groove 126 of the upper part 10, and a plurality of narrow slots shaped and arranged similar to the narrow slots 120 of the upper part 10. The second receiving portion has a same configuration as the first receiving portion 101.

Each of the conductive metal sheets 24 is fixed in a corresponding narrow slot 220 of the second receiving portion. Each of the conductive metal sheets 24 has a contacting terminal 241 and a free terminal 242. The contacting terminal 241 of each of the conductive metal sheets 24 has a same configuration as the contacting terminal 141 of each of the conductive metal sheets 14. The free terminal 242 of each of the conductive metal sheets 24 is defined in the corresponding narrow slot 220 of the second receiving portion. The conductive metal sheets 24 are insulated from one another.

In assembly, the splicing terminal 142 of each of the conductive metal sheets 14 is inserted into a corresponding narrow slot of the second receiving portion through the bottom plates 13 and 23, to be connected to a corresponding conductive metal sheet 24. In this embodiment, the splicing terminal 142 of each of the conductive sheet metals 14 is inserted between the contacting terminal 241 and the free terminal 242 of each of the corresponding conductive sheet metal 24. The upper part 10 and the lower part 20 are fixed together by welding the pads 121 defined on the bottom plate 13 and four pads 221 defined on the bottom plate 23 in one-to-one correspondence. The bottom plates 13 and 23 are mirror image of each other. The arc-shaped groove 122 of the first receiving portion 101 is opposite to the arc-shaped groove of the second receiving portion. The protrusive block 125 of the first receiving portion 101 is opposite to the protrusive block of the second receiving portion.

Figure 4:
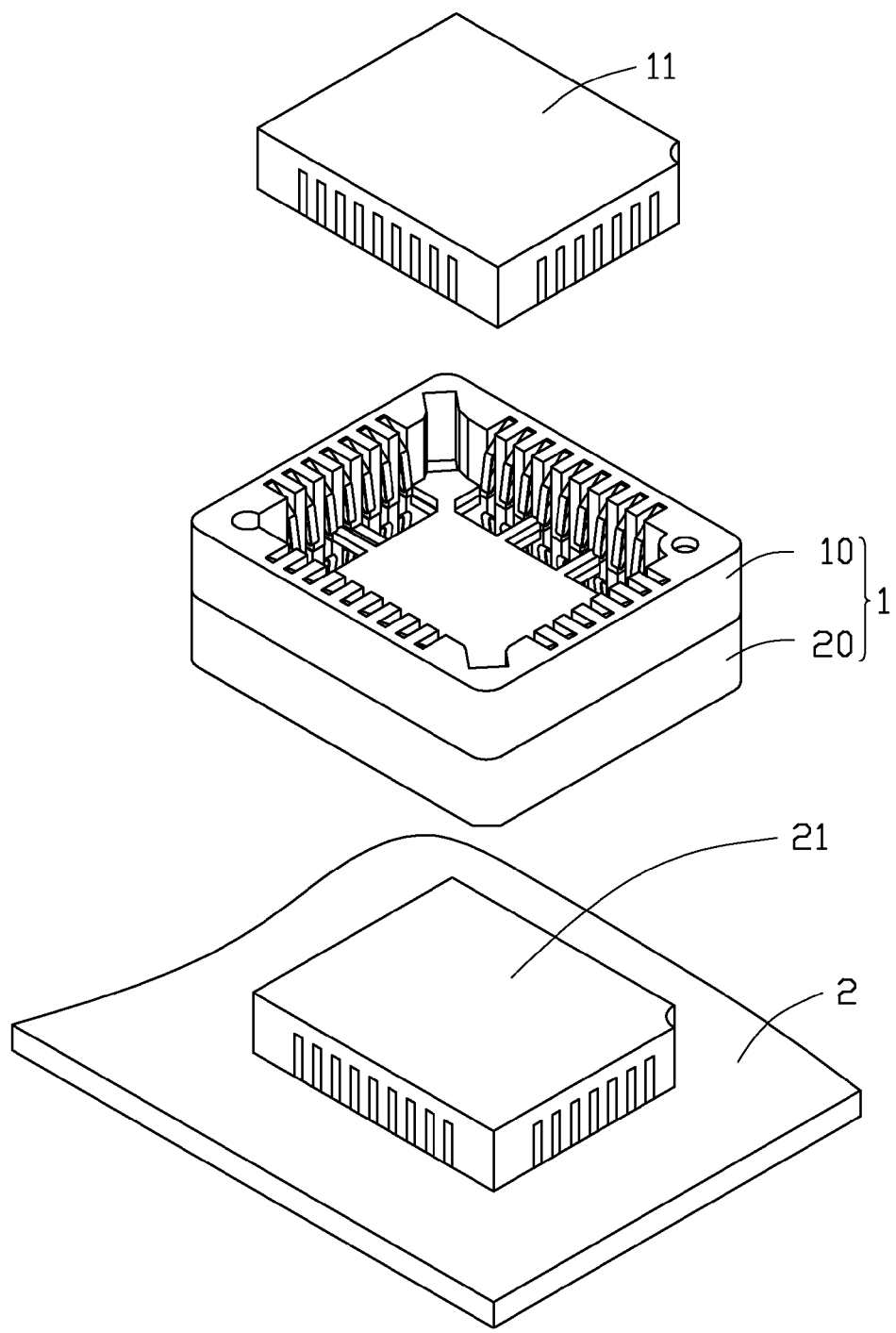
FIG. 4 is a schematic view of the chip socket of FIG. 1 to be mounted on a computer motherboard.

Referring to FIG. 4, in use, the BIOS chip socket 1 is used in a motherboard 2 of a computer to recover a BIOS chip 21 of the motherboard 2 in response to the BIOS chip 21 having been damaged. The second receiving portion is configured to receive the BIOS chip 21, and the first receiving portion 101 is configured to receive a new BIOS chip 11 having same configuration as the BIOS chip 21. Each of the BIOS chips 11 and 21 has four sidewalls configured to define a plurality of conductive pins. A number of conductive pins of a sidewall of the BIOS chip 11 is equal to the number of the narrow slots 120 in a corresponding one of the sidewalls 12a-12d.

The contacting terminals of the conductive metal sheets 24 are connected to the conductive pins of the BIOS chip 21 in response to the BIOS chip 21 being received in the lower part 20. The contacting terminals 141 of the conductive metal sheets 14 are connected to the conductive pins of the BIOS chip 11 in response to the BIOS chip 11 being received in the upper part 10. Therefore, the conductive pins of the BIOS chips 11 and 21 can be connected via the chip socket 1. Information in the BIOS chip 11 is transmitted to the motherboard 2 to execute tasks of the computer automatically, such as checking a complementary metal oxide semiconductor (CMOS) setup custom settings, initiating registers and power management, and performing a power-on self-test.

In this embodiment, the foolproof guides are configured to prevent operation errors during using the BIOS chip socket 1, such as connecting the BIOS chip 11 or 21 with the BIOS chip socket 1 in wrong directions. The foolproof guides can be designed into other configurations according to structures of the BIOS chips 11 and 21.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A chip socket comprising:
an upper part comprising:
a first bottom plate;
four first sidewalls vertically extends upward from four sides of the first bottom plate; and
a plurality of first conductive metal sheets fixed in an inner side of each of the four first sidewalls, the plurality of conductive metal sheets are insulated from one another; and
a lower part comprising:
a second bottom plate directly attached to the first bottom plate;
four second sidewalls vertically extends downward from four sides of the second bottom plate; and
a plurality of second conductive metal sheets fixed in an inner side of each of the four second sidewalls, the plurality of second conductive metal sheets are insulated from one another;
wherein each of the first conductive metal sheets comprises a splicing terminal connected to a corresponding second conductive metal sheet via the splicing terminal extending through the first and second bottom plates to contact with the second conductive metal sheet.

2. The chip socket of claim 1, wherein a plurality of first narrow slots is defined in the inner side of each of the four first sidewalls, a plurality of second narrow slots is defined in the inner side of each of the four second sidewalls, the plurality of first conductive metal sheets is fixed in the plurality of first narrow slots in one-to-one correspondence, the plurality of second conductive metal sheets is fixed in the plurality of second narrow slots in one-to-one correspondence.

3. The chip socket of claim 2, wherein each of the plurality of first conductive metal sheets comprises a contacting terminal elastically defined in the corresponding first narrow slot.

4. The chip socket of claim 3, wherein each of the plurality of second conductive metal sheets comprises a contacting terminal elastically defined in the corresponding second narrow slot, and a free terminal, wherein the splicing terminal of each of the plurality of first conductive metal sheets is inserted between the contacting terminal and the free terminal of the corresponding second conductive metal sheet to connect with the second conductive metal sheet.

5. The chip socket of claim 1, wherein each of the first and second bottom plates is rectangular and comprises four rectangular corners.

6. The chip socket of claim 5, wherein a first pad is formed on each corner of an outside surface of the first bottom plate, a second pad is formed on each corner of an outside surface of the second bottom plate, the first and second bottom plates mirror images of each other by welding the first and second pads together in one-to-one correspondence.

7. The chip socket of claim 1, wherein a first foolproof guide is defined in a corner between every two adjacent first sidewalls of the upper part, a foolproof guide is defined in a corner between every two adjacent second sidewalls of the lower part.

8. The chip socket of claim 7, wherein the first foolproof guides comprise a first arc-shaped groove, two first rectangular grooves, and a first protrusive block, the second foolproof guides comprise a second arc-shaped groove opposite to the first arch groove, two second rectangular grooves, and a protrusive block opposite to the first protrusive block.

9. The chip socket of claim 1, wherein a circular groove is defined in a top surface of a corner of each of the upper part and the lower part.

10. A chip socket for connecting a first chip and a second chip having same numbers of conductive pins, comprising:
a first bottom plate and a second bottom plate directly attached together;
four first sidewalls cooperating with the first bottom plate to bound a first receiving portion, configured to receive the first chip;
four second sidewalls cooperating with the second bottom plate to bound a second receiving portion, configured to receive the second chip;
a plurality of first conductive metal sheets insulated from one another and fixed in an inner side of each of the four first sidewalls configured to be connected to the conductive pins of the first chip correspondingly; and
a plurality of second conductive metal sheets insulated from one another and fixed in an inner side of each of the four second sidewalls configured to be connected to the conductive pins of the second chip correspondingly, wherein the plurality of second conductive metal sheets are connected to the plurality of first conductive metal sheets correspondingly by being inserted in the first receiving portion through the first and second bottom plates.

11. The chip socket of claim 10, wherein each of the first and second bottom plates is a rectangular plate comprising four sides, the first sidewalls vertically extend upward from the four sides of the first bottom plate correspondingly to form the first receiving portion, the second sidewalls vertically extend upward from the four sides of the second bottom plate to form the second receiving portion.

* * * * *